(12) United States Patent
Nakayama et al.

(10) Patent No.: US 8,105,981 B2
(45) Date of Patent: Jan. 31, 2012

(54) SUPERCONDUCTING MEMBER

(75) Inventors: Kohei Nakayama, Kawasaki (JP);
Mutsuki Yamazaki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 635 days.

(21) Appl. No.: 12/199,931

(22) Filed: Aug. 28, 2008

(65) Prior Publication Data

US 2009/0082211 A1    Mar. 26, 2009

(30) Foreign Application Priority Data

Sep. 20, 2007   (JP) .................. 2007-243848

(51) Int. Cl.
*H01L 39/24* (2006.01)
*H01P 1/203* (2006.01)
*H01B 12/02* (2006.01)
*C23C 14/08* (2006.01)

(52) U.S. Cl. ........ 505/238; 505/210; 505/470; 505/703; 428/701; 428/702; 333/99 S; 333/204; 333/205; 427/62

(58) Field of Classification Search .............. 505/210, 505/191, 237, 238, 701, 866; 333/99 S, 204, 333/219, 205; 428/323, 700, 701; 427/62
See application file for complete search history.

(56) References Cited

U.S. PATENT DOCUMENTS 5,162,294 A * 11/1992 Talvacchio et al. ........... 505/237
2004/0254078 A1* 12/2004 Athinarayanan et al. ..... 505/100

FOREIGN PATENT DOCUMENTS

| JP | 06-334228 | * 12/1994 |
| JP | 6-334228 | 12/1994 |
| JP | 2004-207482 | * 12/2002 |
| JP | 2004-063562 | * 2/2004 |
| JP | 2004-207482 | 7/2004 |
| JP | 2004-244263 | * 9/2004 |
| JP | 2004-303846 | * 10/2004 |
| JP | 2005-290528 | * 10/2005 |

OTHER PUBLICATIONS

Lee et al, "Significant improvements in the surface smoothness of YBa2Cu3O7-d films on high temperature annealed CeO2-buffered r-cut sapphire," Superconduct. Sci. Tech, 2000, 13, pp. 989-994.*
Schneider et al, "Resonators and filters made of YBaCuO thin films on sapphire wafers," Physica C, 2001, 351, pp. 21-24.*
Geerk, "Simultanesous Double-Sided Deposition of HTS Films on 3-in Wafers ICM-sputtering," IEEE Trans. on Appl. Superconduct. 1999, 9(2), 1543-1546.*

* cited by examiner

*Primary Examiner* — Stanley Silverman
*Assistant Examiner* — Kallambella Vijayakumar
(74) *Attorney, Agent, or Firm* — Oblon, Spivak, McClelland, Maier & Neustadt, L.L.P.

(57) ABSTRACT

This invention provides a thin superconducting oxide film, which can realize a high critical current, and a superconducting member having a high level of electric power resistance. The superconducting member comprises a sapphire R face substrate, a buffer layer formed of grain lumps of an oxide provided on the sapphire R face substrate, and a superconducting layer provided on the buffer layer. The nearest neighbor distance between oxygen atoms in the oxide and the grain diameter of grain lumps of the oxide have been specified. The superconducting member can be used as a member for superconducting filters.

15 Claims, 2 Drawing Sheets

SUPERCONDUCTING MEMBER

CROSS-REFERENCE TO RELATED APPLICATIONS

This application is based upon and claims the benefit of priority from the prior Japanese Patent Applications No. 243848/2007, filed on Sep. 20, 2007; the entire contents of which are incorporated herein by reference.

BACKGROUND OF THE INVENTION

1. Field of the Invention

The present invention relates to a superconducting member. More particularly, the present invention relates to a superconducting member comprising a super conducting material in a part of a component which can transmit a high frequency electric power having a predetermined frequency on the order of MHz or more selectively and with low loss.

2. Background Art

Superconducting filters can realize the production of a small-size resonator having a small material loss and a high Q value. Consequently, steep skirt properties unattainable by the conventional filter can be realized, and, hence, efforts have been made to put high frequency filters on the order of MHz or more to practical use. Among others, $ReBa_2Cu_3O_{7-\delta}$, wherein Re represents not more than three elements selected from lanthanum (La), yttrium (Y), samarium (Sm), europium (Eu), gadolinium (Gd), dysprosium (Dy), ytterbium (Yb), neodymium (Nd), holmium (Ho), and erbium (Er) (hereinafter referred to as "(Re)BCO"), which has a superconducting transition temperature of about 90 K and a high critical current value, is expected as a promising material.

Sapphire substrates are considered as optimal substrates for the preparation of high frequency filter circuits, for example, from the viewpoints of relatively low price as a large-area single crystal substrate, a suitable permittivity necessary for the preparation of high frequency circuits on the order of MHz or more, high mechanical strength, and large low-temperature thermal conductivity.

However, it is very difficult to form an (Re)BCO film having good superconducting properties directly on the sapphire substrate, and, so far as the present inventors know, there is no report about any example of success in forming such films. At the present stage, a method has been extensively adopted as a solution to the problem in which a buffer layer is first grown on a sapphire substrate and a thin superconducting film is then grown on the buffer layer. When this method is applied, due to lattice matching between the superconducting material and the material constituting the buffer layer, it is common practice to form a buffer layer having a lattice constant close to that of the superconducting material, for example, ceria or YSZ, on an R face (1102) or an A face (1120) of the sapphire substrate and then to form a thin (Re)BCO film on the buffer layer.

In order to improve the properties of a thin superconducting film formed on the upper part of the buffer layer, the buffer layer used in this method has hitherto been required not to sacrifice the crystallinity of the superconductor used.

To meet this demand, studies have been forwarded with a view to maximizing the flatness of the buffer layer and maximizing the oblateness of the grain lumps. This is because the buffer layer assumes the superconducting properties of the (Re)BCO super conductor. It is considered that the superconducting properties are improved with reducing the concavoconvexes of a CuO two-dimensional network structure formed of Cu atoms and O atoms.

In fact, it is known that, due to the nature of the crystal structure, mercury(Hg)-type copper oxides having small concavoconvexes in the CuO network structure is unsuitable for practical use because of their many problems with raw materials and production process used, but on the other hand, by virtue of good superconducting properties, the superconducting transition temperature is high and 100 K or above.

Any technique for accurately regulating the surface shape of the buffer layer provided on the sapphire substrate has not been established yet. A current main recognition on the thin superconducting film formation is that the formation of a flat buffer layer having a flatter surface shape can realize the formation of a thin superconducting film having better crystallinity which in its turn can provide a thin superconducting film having excellent superconducting properties. Accordingly, at the present time, the development of a method for forming a flatter surface shape as the buffer layer for a thin superconducting film is forwarded.

However, it is very difficult to realize an (Re)BCO film having a large thickness of not less than 300 nm and simultaneously possessing excellent crystallinity and excellent superconducting properties. The reason for this is considered attributable to the influence of internal strain of crystal constituting the film which increases with increasing the thickness of the film, but any apparent reason has not been elucidated yet.

Further, it should be noted that, when an (Re)BCO film having a thickness of not less than 300 nm is formed on the surface of the sapphire substrate, the realization of a critical current density at a liquid nitrogen temperature (hereinafter abbreviated to "$J_c$") of not less than $4.0 \times 10^6$ A/cm$^2$ is difficult. For this reason, a satisfactorily large critical current value (hereinafter referred to as "$I_c$") necessary for applications in transmission in high frequency filters, or applications in electric power where a large current should be allowed to flow into a superconductor has not been realized.

Accordingly, at the present time, studies on the preparation of a film having a large thickness of not less than 1 μm by providing an atom step on the substrate surface to relax the crystal strain of the thin film are forwarded. When this method as such is used, a thick film having a thickness of about 1 μm which exhibits superconducting properties can be prepared, but, when a sapphire substrate is used, it is difficult to provide an $I_c$ (=$J_c$×film thickness) value of not less than 250 A/cm at a liquid nitrogen temperature. Further, when this method is applied to form a superconducting layer or a buffer layer on the upper part of an R face sapphire substrate with concavoconvexes having a size of not less than 5 nm, the crystallinity of the superconducting layer and the buffer layer cannot be maintained, making it impossible to provide good superconducting properties in the superconducting layer provided on the buffer layer, not to mention in the superconducting layer provided directly on the substrate.

Accordingly, at the present time, in order to prepare a thick superconducting film having excellent superconducting properties, it is necessary to clarify that which shape is required in the surface structure of the buffer layer as a base for the superconducting film. Up to now, however, since any technique for accurately regulating the surface shape of the buffer layer provided on the sapphire substrate has not been established, it has been very difficult to examine the surface shape of the buffer layer necessary for the superconducting layer provided on the buffer layer.

SUMMARY OF THE INVENTION

An object of the present invention is to prepare a thin (Re)BCO film which can realize high $J_c$ without cracking. To this end, in order to relax lattice strain caused by lattice mismatching between the substrate and the thin superconducting film, a thin superconducting oxide film, which can realize a higher critical face current, is prepared by providing a specific buffer layer between the substrate and the thin superconducting film, and a superconducting member having a high level of electric power resistance is provided.

According to the present invention, there is provided a superconducting member comprising: a sapphire R face substrate; a buffer layer provided on at least one surface of the sapphire R face substrate; and a superconducting layer provided on the buffer layer, wherein the buffer layer is formed of grain lumps of an oxide, the nearest neighbor distance between the oxygen atoms constituting a crystal face of the oxide parallel to the substrate surface is not more than 0.2705 nm, and not less than 90% of grain lumps constituting the buffer layer have a grain diameter of not less than 20 nm and not more than 70 nm.

Further, according to the present invention, there is provided a superconducting filter comprising the above superconducting member.

Furthermore, according to the present invention, there is provided a process for producing a superconducting member, comprising:

providing a sapphire R face substrate;

forming a buffer layer of grain lumps of an oxide on at least one surface of the substrate; and forming a superconducting layer on the buffer layer, wherein the oxide is controlled so that the nearest neighbor distance between oxygen atoms constituting a crystal face of the oxide parallel to the substrate surface is not more than 0.2705 nm, and not less than 90% of grain lumps constituting the buffer layer have a grain diameter of not less than 20 nm and not more than 70 nm.

According to the present invention, a thin (Re)BCO film having a $J_c$ value of not less than $4.1 \times 10^6$ A/cm$^2$ can be grown on an R face cut sapphire single crystal substrate, which is generally available at low cost through a buffer layer of an oxide to about 1 μm, without cracking.

DETAILED DESCRIPTION OF THE INVENTION

The present invention relates to a superconducting member, for example, a superconducting filter. The present invention will be described in conjunction with the accompanying drawings.

Figure 1:
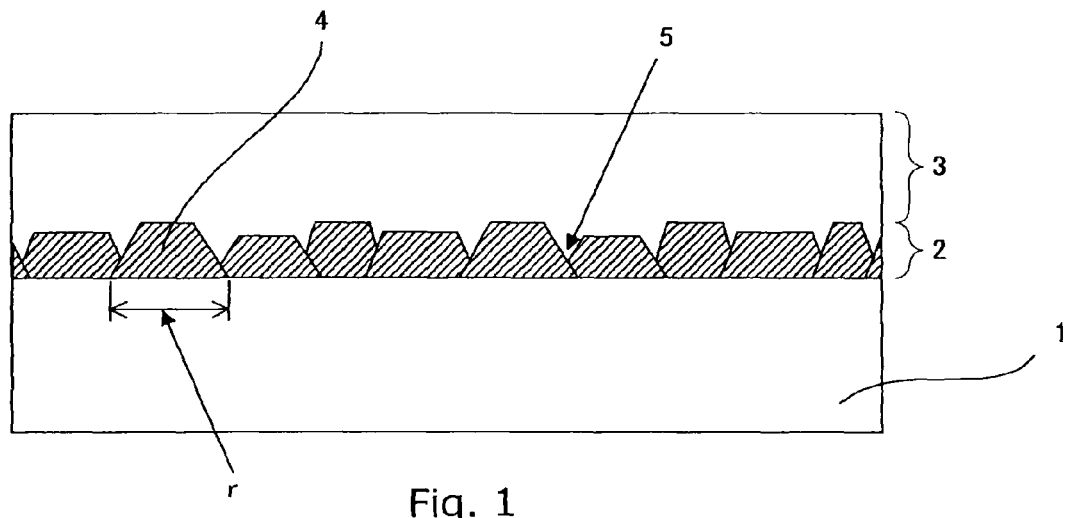
FIG. 1 is a cross-sectional view of a superconducting member in one embodiment of the present invention.
Figure 2:
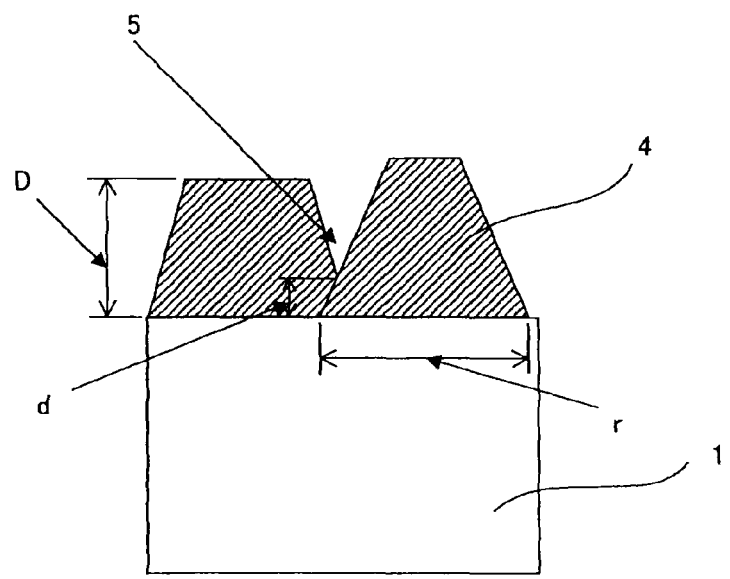
FIG. 2 is an enlarged cross-sectional view of a superconducting member in one embodiment of the present invention.

The superconducting member according to the present invention may be used for the preparation of a high frequency circuit on a substrate, for example, an R face cut sapphire single crystal substrate which is generally available at low cost. FIGS. 1 and 2 are cross-sectional views of a superconducting member in one embodiment of the present invention. FIG. 2 is an enlarged view of a part of FIG. 1. In this superconducting member, as shown in FIG. 1, a buffer layer 2 formed of an oxide material is provided on a surface of an R face sapphire substrate 1. The buffer layer is formed as an aggregate of grain lumps 4, and valley-shaped structure 5 is formed between the grain lumps. An (Re)BCO layer, that is, a superconducting layer, is formed on the buffer layer. Specific methods usable for buffer layer formation include, but are not limited to, CVD, vacuum vapor deposition, sputtering, and laser ablation. During the growth of the buffer layer 2, the grain diameter r of the grain lumps 4 constituting the buffer layer 2 is regulated by the temperature of a part close to the substrate (hereinafter referred to as "substrate temperature") immediately after the start of the film formation during the growth and the growth rate. In the present invention, the grain diameter of grain lumps is the major axis of a face where the grain lumps are in contact with the substrate when the film face is observed under a transmission electron microscope. In the present invention, the buffer layer is accurately regulated so that not less than 90% of the grain lumps of the oxide constituting the buffer layer have a grain diameter of not less than 20 nm and not more than 70 nm, preferably not less than 30 nm and not more than 60 nm. Further, regarding the index of the surface shape of the buffer layer, as shown in FIG. 2, the value of (D−d) is defined from the thickness D [nm] of the grain lump 4 constituting the buffer layer 2 and the thickness d [nm] of the grain lump 4 in its part in contact with the adjacent another grain lump. The surface shape of the buffer layer 2 is regulated by the oxygen pressure during the growth and the above D value so that not less than 90% of the grain lumps of the buffer layer satisfy a requirement of 5 nm≦D−d≦20 nm. The formation of a buffer layer having the above grain lump shape and surface shape with good accuracy can realize the introduction of a large electric power into the thin superconducting film formed on the upper part of the buffer layer.

FIG. 1 shows an embodiment in which a buffer layer and a superconducting layer are provided on one side of a substrate. When these layers are formed on both sides of the substrate and, for example, one side of the assembly is used as a magnetic shielding layer while a filter circuit is prepared on the other side of the assembly, whereby large electric power can be introduced without sacrificing the properties of the filter circuit.

Figure 3:
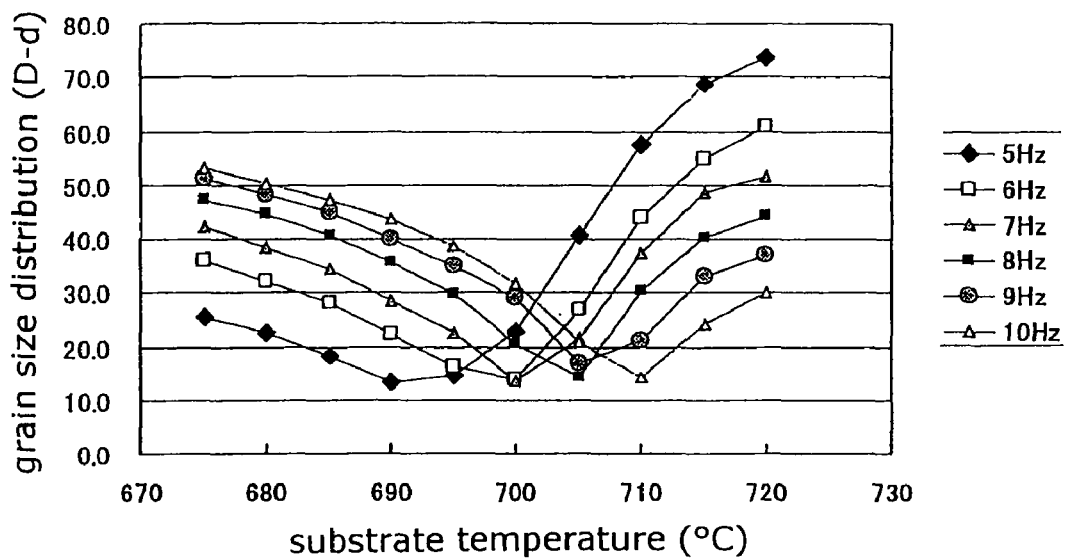
FIG. 3 is a diagram showing the relationship between the substrate temperature in buffer layer formation and the grain size distribution of grain lumps.
Figure 4:
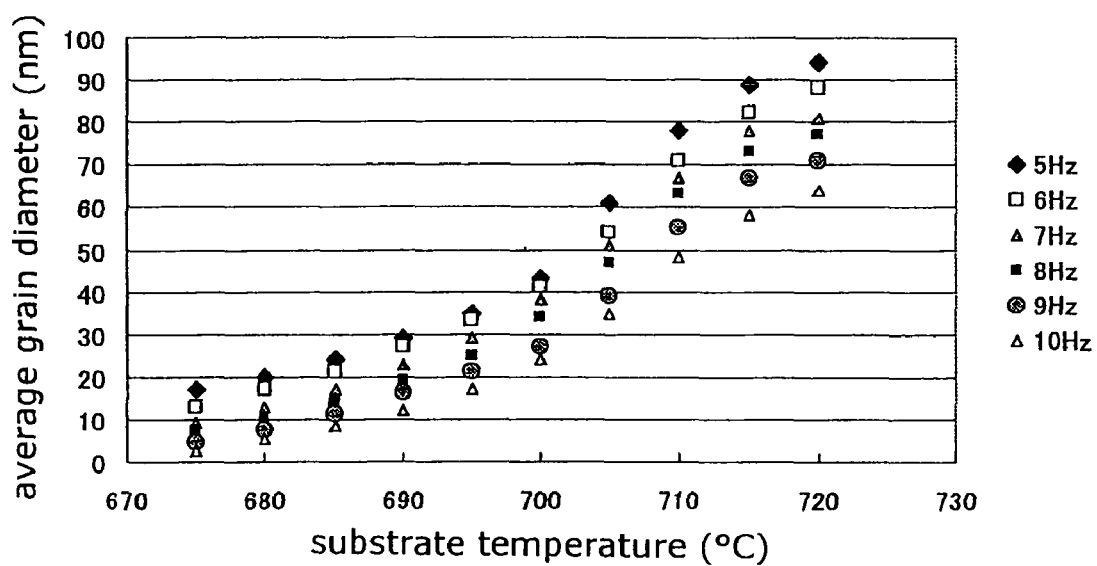
FIG. 4 is a diagram showing the relationship between the substrate temperature in buffer layer formation and the average grain diameter of grain lumps.

For example, when CeO$_2$, which is grown by a laser ablation method, is used as a material for constituting the buffer layer, the relationship between the breadth of the grain size distribution and the substarate temperature during buffer layer growth and the growth rate regulated by the repetition frequency of the laser pulse is as shown in FIG. 3, and the relationship between the average grain diameter and the substrate temperature and the repetition frequency of the laser pulse is as shown in FIG. 4. In order to realize the relationship shown in FIGS. 3 and 4, preferably, the difference in substrate temperature between immediately after the start of the film formation and immediately after the completion of buffer layer formation is regulated to fall within the range of 40° C. to 45° C. When the film is formed at a constant heater output, disadvantageously, the temperature difference is in many cases 60° C. or more. Accordingly, the output of the heater should be regulated so that the temperature of the substrate falls within the specified range. The temperature of the substrate sometimes varies depending upon the place where a sensor for measuring the substrate is installed, and a measuring method. Therefore, regulation should be carried out according to the apparatus and conditions.

The value of (D−d) defined above can be accurately regulated by regulating the oxygen pressure during buffer layer growth and selecting the thickness of the buffer layer. It is generally known that, when the oxygen pressure during the growth varies, the surface shape of the thin film varies, and the above-defined value of (D−d) usually has a large breadth. In particular, the minimum value of (D−d) is a very small value independently of the oxygen pressure. Accordingly, when the D value is increased to a value large enough to effectively function as the buffer layer, the breadth of the value of (D−d) is very large and the regulation of the value of (D−d) to a given range is difficult. On the other hand, in the present invention, the value of (D−d) can be regulated to a given range by setting the oxygen pressure in an early stage of the growth of the buffer layer to a specified value or less. Specifically, in order to suppress the breadth of the value of (D−d), preferably, in the early stage of the film formation, the oxygen pressure is set to not more than 3 Pa, more preferably not more than 1.2 Pa. Thereafter, at the stage when the thickness of the buffer layer has been increased to 10 to 20% of the contemplated buffer layer thickness, the oxygen pressure is changed to a specific set value to allow the buffer layer to grow to the contemplated thickness. The above method can suppress the value of (D−d) to a given range. One example thereof is shown in Table 1.

A superconducting layer is further provided on the buffer layer thus formed to produce the superconducting member according to the present invention. As described above, the material for the superconducting layer is preferably formed of $ReBa_2Cu_3O_{7-\delta}$ wherein Re represents not more than three elements selected from lanthanum (La), yttrium (Y), samarium (Sm), europium (Eu), gadolinium (Gd), dysprosium (Dy), ytterbium (Yb), neodymium (Nd), holmium (Ho), and erbium (Er). However, other superconducting materials may also be used. These superconducting materials are formed on the buffer layer, for example, by CVD, vacuum vapor deposition, sputtering, or laser ablation. Growth conditions in this case are not particularly limited, and conditions commonly used in the production of superconducting materials may be adopted.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

EXAMPLES

In relationships shown in FIGS. 3 and 4, buffer layers were formed by regulating the grain diameter r [nm] of grain lumps of an oxide constituting a buffer layer 2 and the distribution of the grain diameter for various buffer layer materials. A 500 nm-thick thin YBCO film was grown on the buffer layers. For the superconducting members thus obtained, the critical current density $J_c$ was measured. The results thus obtained were as shown in Table 2. In Table 2, the grain diameter r of the grain lumps of the buffer layer is expressed in a diameter range. For example, 10 nm $\leq$ r $\leq$ 30 nm means that the grain diameter of not less than 90% of grain lumps which can be confirmed by a sectional TEM image is in the range of 10 nm $\leq$ r $\leq$ 30 nm. The same studies have been made for superconducting layers, i.e., a 500 nm-thick thin YbBCO film and a 500 nm-thick thin NdBCO film different from each other in lattice constant. The results are shown in Tables 3 and 4.

TABLE 1

| | | D, nm | | | | |
|---|---|---|---|---|---|---|
| | | 15 | 30 | 50 | 75 | 100 |
| Oxygen pressure, Pa | 3 | — $\leq$ D-d $\leq$ 5 | — $\leq$ D-d $\leq$ 5 | — $\leq$ D-d $\leq$ 6 | — $\leq$ D-d $\leq$ 9 | — $\leq$ D-d $\leq$ 12 |
| | 5 | — $\leq$ D-d $\leq$ 5 | — $\leq$ D-d $\leq$ 5 | — $\leq$ D-d $\leq$ 7 | — $\leq$ D-d $\leq$ 10 | 6 $\leq$ D-d $\leq$ 13 |
| | 8 | — $\leq$ D-d $\leq$ 5 | — $\leq$ D-d $\leq$ 5 | — $\leq$ D-d $\leq$ 8 | 5 $\leq$ D-d $\leq$ 11 | 7 $\leq$ D-d $\leq$ 15 |
| | 10 | — $\leq$ D-d $\leq$ 5 | — $\leq$ D-d $\leq$ 5 | — $\leq$ D-d $\leq$ 8 | 6 $\leq$ D-d $\leq$ 12 | 7 $\leq$ D-d $\leq$ 16 |
| | 13 | — $\leq$ D-d $\leq$ 5 | — $\leq$ D-d $\leq$ 6 | — $\leq$ D-d $\leq$ 9 | 7 $\leq$ D-d $\leq$ 14 | 9 $\leq$ D-d $\leq$ 19 |
| | 15 | — $\leq$ D-d $\leq$ 5 | — $\leq$ D-d $\leq$ 6 | — $\leq$ D-d $\leq$ 10 | 7 $\leq$ D-d $\leq$ 15 | 10 $\leq$ D-d $\leq$ 20 |
| | 20 | — $\leq$ D-d $\leq$ 5 | — $\leq$ D-d $\leq$ 8 | 6 $\leq$ D-d $\leq$ 13 | 9 $\leq$ D-d $\leq$ 19 | 13 $\leq$ D-d $\leq$ 25 |
| | 25 | — $\leq$ D-d $\leq$ 5 | — $\leq$ D-d $\leq$ 9 | 8 $\leq$ D-d $\leq$ 16 | 12 $\leq$ D-d $\leq$ 23 | 16 $\leq$ D-d $\leq$ 31 |
| | 30 | — $\leq$ D-d $\leq$ 6 | — $\leq$ D-d $\leq$ 11 | 11 $\leq$ D-d $\leq$ 19 | 16 $\leq$ D-d $\leq$ 29 | 22 $\leq$ D-d $\leq$ 38 |
| | 35 | — $\leq$ D-d $\leq$ 7 | — $\leq$ D-d $\leq$ 14 | 14 $\leq$ D-d $\leq$ 24 | 21 $\leq$ D-d $\leq$ 35 | 28 $\leq$ D-d $\leq$ 47 |
| | 40 | — $\leq$ D-d $\leq$ 9 | 9 $\leq$ D-d $\leq$ 21 | 18 $\leq$ D-d $\leq$ 29 | 28 $\leq$ D-d $\leq$ 44 | 37 $\leq$ D-d $\leq$ 58 |
| | 45 | — $\leq$ D-d $\leq$ 11 | 21 $\leq$ D-d $\leq$ 25 | 24 $\leq$ D-d $\leq$ 36 | 36 $\leq$ D-d $\leq$ 54 | 48 $\leq$ D-d $\leq$ 72 |
| | 50 | — $\leq$ D-d $\leq$ 13 | 23 $\leq$ D-d $\leq$ 27 | 31 $\leq$ D-d $\leq$ 45 | 47 $\leq$ D-d $\leq$ 67 | 63 $\leq$ D-d $\leq$ 89 |

| | | D, nm | | | |
|---|---|---|---|---|---|
| | | 125 | 150 | 175 | 200 |
| Oxygen pressure, Pa | 3 | — $\leq$ D-d $\leq$ 15 | 7 $\leq$ D-d $\leq$ 19 | 9 $\leq$ D-d $\leq$ 22 | 10 $\leq$ D-d $\leq$ 25 |
| | 5 | 7 $\leq$ D-d $\leq$ 17 | 9 $\leq$ D-d $\leq$ 20 | 10 $\leq$ D-d $\leq$ 23 | 11 $\leq$ D-d $\leq$ 27 |
| | 8 | 8 $\leq$ D-d $\leq$ 19 | 10 $\leq$ D-d $\leq$ 23 | 12 $\leq$ D-d $\leq$ 26 | 13 $\leq$ D-d $\leq$ 30 |
| | 10 | 9 $\leq$ D-d $\leq$ 21 | 11 $\leq$ D-d $\leq$ 25 | 13 $\leq$ D-d $\leq$ 29 | 15 $\leq$ D-d $\leq$ 33 |
| | 13 | 11 $\leq$ D-d $\leq$ 23 | 13 $\leq$ D-d $\leq$ 28 | 15 $\leq$ D-d $\leq$ 33 | 17 $\leq$ D-d $\leq$ 37 |
| | 15 | 12 $\leq$ D-d $\leq$ 25 | 15 $\leq$ D-d $\leq$ 31 | 17 $\leq$ D-d $\leq$ 36 | 19 $\leq$ D-d $\leq$ 41 |
| | 20 | 16 $\leq$ D-d $\leq$ 31 | 19 $\leq$ D-d $\leq$ 38 | 22 $\leq$ D-d $\leq$ 44 | 25 $\leq$ D-d $\leq$ 50 |
| | 25 | 21 $\leq$ D-d $\leq$ 39 | 25 $\leq$ D-d $\leq$ 47 | 29 $\leq$ D-d $\leq$ 54 | 33 $\leq$ D-d $\leq$ 62 |
| | 30 | 27 $\leq$ D-d $\leq$ 48 | 32 $\leq$ D-d $\leq$ 57 | 38 $\leq$ D-d $\leq$ 67 | 43 $\leq$ D-d $\leq$ 77 |
| | 35 | 35 $\leq$ D-d $\leq$ 59 | 42 $\leq$ D-d $\leq$ 71 | 49 $\leq$ D-d $\leq$ 83 | 56 $\leq$ D-d $\leq$ 95 |
| | 40 | 46 $\leq$ D-d $\leq$ 73 | 55 $\leq$ D-d $\leq$ 88 | 64 $\leq$ D-d $\leq$ 102 | 73 $\leq$ D-d $\leq$ 117 |
| | 45 | 60 $\leq$ D-d $\leq$ 90 | 72 $\leq$ D-d $\leq$ 108 | 84 $\leq$ D-d $\leq$ 126 | 96 $\leq$ D-d $\leq$ 144 |
| | 50 | 78 $\leq$ D-d $\leq$ 111 | 94 $\leq$ D-d $\leq$ 134 | 110 $\leq$ D-d $\leq$ 156 | 125 $\leq$ D-d $\leq$ 175 |

TABLE 2

| Buffer layer material | Distance between nearest neighbor oxygen atoms R, nm | $J_c$ of thin YBCO film in relation to grain diameter r (nm) of grain lumps of buffer layer, ×10$^6$ A/cm$^2$ | | | | | | | |
|---|---|---|---|---|---|---|---|---|---|
| | | r ≤ 20 | 10 ≤ r ≤ 30 | 20 ≤ r ≤ 40 | 30 ≤ r ≤ 50 | 40 ≤ r ≤ 60 | 50 ≤ r ≤ 70 | 60 ≤ r ≤ 80 | 70 ≤ r |
| SrSnO$_3$ | 0.2852 | <0.5 | <0.5 | 0.7 | 1.0 | 1.3 | 1.8 | 2.4 | 2.3 |
| BaSnO$_3$ | 0.2911 | <0.5 | <0.5 | <0.5 | <0.5 | <0.5 | <0.5 | <0.5 | <0.5 |
| LaAlO$_3$ | 0.2679 | 1.1 | 1.6 | 2.8 | 4.4 | 3.9 | 2.3 | 0.9 | <0.5 |
| CeO$_2$ | 0.2705 | 0.8 | 1.2 | 2.2 | 3.6 | 5.4 | 4.2 | 2.0 | <0.5 |
| Y$_2$O$_3$ | 0.2651 | 2.2 | 3.1 | 4.1 | 4.3 | 3.1 | 2.7 | 0.8 | <0.5 |
| Dy$_2$O$_3$ | 0.2666 | 1.7 | 2.3 | 3.3 | 5.1 | 4.9 | 3.5 | 1.9 | 0.9 |
| Nd$_2$O$_3$ | 0.2769 | <0.5 | <0.5 | 0.9 | 1.6 | 2.5 | 3.4 | 3.1 | 1.9 |

TABLE 3

| Buffer layer material | Distance between nearest neighbor oxygen atoms R, nm | $J_c$ of thin YBCO film in relation to grain diameter r (nm) of grain lumps of buffer layer, ×10$^6$ A/cm$^2$ | | | | | | | |
|---|---|---|---|---|---|---|---|---|---|
| | | r ≤ 20 | 10 ≤ r ≤ 30 | 20 ≤ r ≤ 40 | 30 ≤ r ≤ 50 | 40 ≤ r ≤ 60 | 50 ≤ r ≤ 70 | 60 ≤ r ≤ 80 | 70 ≤ r |
| SrSnO$_3$ | 0.2852 | <0.5 | <0.5 | <0.5 | <0.5 | <0.5 | <0.5 | <0.5 | <0.5 |
| BaSnO$_3$ | 0.2911 | <0.5 | <0.5 | <0.5 | <0.5 | <0.5 | <0.5 | <0.5 | <0.5 |
| LaAlO$_3$ | 0.2679 | <0.5 | 0.7 | 1.2 | 3.8 | 2.2 | 1.1 | <0.5 | <0.5 |
| CeO$_2$ | 0.2705 | <0.5 | 0.7 | 1.4 | 3.2 | 2.4 | 2.2 | 1.1 | <0.5 |
| Y$_2$O$_3$ | 0.2651 | 1.3 | 1.8 | 2.5 | 2.8 | 1.8 | 1.2 | <0.5 | <0.5 |
| Dy$_2$O$_3$ | 0.2666 | 0.8 | 1.2 | 1.6 | 3.1 | 2.7 | 2.3 | 1.1 | 0.6 |
| Nd$_2$O$_3$ | 0.2769 | <0.5 | <0.5 | <0.5 | 0.7 | 1.3 | 1.4 | 1.2 | 0.8 |

TABLE 4

| Buffer layer material | Distance between nearest neighbor oxygen atoms R, nm | $J_c$ of thin YBCO film in relation to grain diameter r (nm) of grain lumps of buffer layer, ×10$^6$ A/cm$^2$ | | | | | | | |
|---|---|---|---|---|---|---|---|---|---|
| | | r ≤ 20 | 10 ≤ r ≤ 30 | 20 ≤ r ≤ 40 | 30 ≤ r ≤ 50 | 40 ≤ r ≤ 60 | 50 ≤ r ≤ 70 | 60 ≤ r ≤ 80 | 70 ≤ r |
| SrSnO$_3$ | 0.2852 | <0.5 | <0.5 | <0.5 | 0.8 | 1.1 | 1.2 | 1.3 | 1.1 |
| BaSnO$_3$ | 0.2911 | <0.5 | <0.5 | <0.5 | <0.5 | <0.5 | <0.5 | <0.5 | <0.5 |
| LaAlO$_3$ | 0.2679 | 0.7 | 1.3 | 2.2 | 3.5 | 3.1 | 1.8 | 0.7 | <0.5 |
| CeO$_2$ | 0.2705 | 0.6 | 1.0 | 1.8 | 2.9 | 4.3 | 3.4 | 1.6 | <0.5 |
| Y$_2$O$_3$ | 0.2651 | 1.8 | 2.5 | 3.3 | 3.4 | 2.5 | 2.2 | 0.6 | <0.5 |
| Dy$_2$O$_3$ | 0.2666 | 1.4 | 1.8 | 2.6 | 4.1 | 3.9 | 2.8 | 1.5 | 0.9 |
| Nd$_2$O$_3$ | 0.2769 | <0.5 | <0.5 | <0.5 | 0.9 | 2.3 | 3.1 | 2.8 | 1.7 |

As shown in Tables 2 to 4, different oxides have been used as the buffer layer material. These materials are different from each other in distance R (nm) between the nearest neighbor oxygen atoms. The distance R (nm) between the nearest neighbor oxygen atoms is the distance between the nearest neighbor oxygen atoms in a crystal face of the buffer layer parallel to the interface of the buffer layer and the substrate. The results shown in Table 2 show that the $J_c$ value of the thin superconducting film can be brought to not less than $4.1 \times 10^6$ A/cm$^2$ by regulating the grain diameter of not less than 90% of the grain lumps of the oxide constituting the buffer layer to the range of 20 nm ≤ r ≤ 70 nm, preferably 30 nm ≤ r ≤ 60 nm, using, as the material for the buffer layer, a material, which provides an R value of not more than 0.2705 nm, specifically LaAlO$_3$, CeO$_2$, Y$_2$O$_3$, Dy$_2$O$_3$ or the like.

Further, the results in Tables 3 and 4 show that a $J_c$ value of not less than $2.0 \times 10^6$ A/cm$^2$ for YbBCO and a $J_c$ value of not less than $3.3 \times 10^6$ A/cm$^2$ for NdBCO can be realized by regulating the type and grain diameter of the buffer layer so as to satisfy the above requirements even in the case of (Re)BCO wherein Re=ytterbium (Yb) or neodymium (Nd) which is different from YBCO in film formation conditions and lattice constant.

As is apparent from the above results, in order to improve the superconducting properties of (Re)BCO layer independently of the lattice constant of thin (Re)BCO layer film although the level of the effect varies depending upon the lattice constant, a method is effective in which a buffer layer material which brings the distance R between the nearest neighbor oxygen atoms in a crystal face of the buffer layer parallel to the interface of the buffer layer and the substrate to not more than 0.2705 nm is used, and the grain diameter of not less than 90% of the grain lumps of the oxide constituting the buffer layer is regulated to the range of 20 nm ≤ r ≤ 70 nm.

The reason for this is considered as follows. (1) In such a state that the distance R between the nearest neighbor oxygen atoms in the buffer layer specified in the present invention is smaller than the distance between copper atoms in the thin superconducting film, the strain force by which the thin film per se is likely to be spread toward the horizontal direction of the substrate increases with increasing the thickness of the thin superconducting film. In this case, however, since the side face of the grain lump in the buffer layer is slanted to constitute a slant face, the strain against the spreading is relaxed. (2) The strain is absorbed by the interface of grain lumps in the superconducting layer formed in a valley-shaped part to prevent cracking within the superconducting layer, whereby a deterioration in superconducting properties can be prevented. (3) Consequently, when the slope is excessively small due to excessively large grain diameter or when the slope of the side face is excessively large due to excessively small grain diameter, the improper slope is causative of cracking within the superconducting layer, resulting in deteriorated superconducting properties.

The shape of the surface of the grain lumps in the buffer layer is considered to affect the strain of the superconducting layer. Accordingly, a thin YBCO film was grown to 500 nm on the upper part of the buffer layer formed in the same manner as in the case where the results shown in Table 1 was obtained, and the $J_c$ value of the thin YBCO film was measured. The results thus obtained were as shown in Table 5. The results in Tables 1 and 5 show that a $J_c$ value of thin YBCO film of not less than $4\times10^6$ A/cm$^2$ can be realized by regulating the value of (D−d) of the CeO$_2$ layer to not less than 5 nm and not more than 20 nm. Further, it is apparent that, when the oxygen pressure in an early stage of the growth of the buffer layer is properly set to grow the buffer layer, a high $J_c$ value can be realized by bringing the D value to not less than 50 nm and not more than 150 nm.

In this measurement, the buffer layer was such that the material for the buffer layer was CeO$_2$, and the surface shape was regulated so that the grain diameter of not less than 90% of the grain lumps of the material and the value of (D−d) of not less than 90% of the grain lumps were in the range of 20 nm $\leq$ r $\leq$ 70 nm and not less than 5 nm and not more than 20 nm, respectively.

TABLE 6

| Film thickness, nm | $J_c$ of (Re)BCO, $\times 10^6$ A/cm$^2$ | | |
|---|---|---|---|
| | Yb | Y | Nd |
| 300 | 3.1 | 5.5 | 4.6 |
| 350 | 3.1 | 5.5 | 4.6 |
| 400 | 3.1 | 5.5 | 4.1 |
| 500 | 2.8 | 5.3 | 4.1 |
| 600 | 2.8 | 4.6 | 3.6 |
| 700 | 2.8 | 4.0 | 3.2 |
| 800 | 2.5 | 3.5 | 2.8 |
| 900 | 2.3 | 3.2 | 2.5 |
| 1000 | 1.6 | 3.1 | 2.3 |
| 1100 | 0.6 | 2.3 | 0.8 |
| 1200 | <0.5 | 0.8 | <0.5 |

From the results in Table 6, it is apparent that, when the layer thickness was not more than 300 nm, no satisfactory $I_c$ (=$J_c\times$film thickness) value can be obtained, and, in a layer thickness up to 900 to 1000 nm, the $I_c$ value is increased while, when the layer thickness exceeds 1000 nm, the properties are significantly deteriorated, indicating that the thickness of the (Re)BCO film, that is, the thickness of the superconducting layer, is preferably not less than 350 nm and not more than 1000 nm, more preferably not less than 400 nm and not more than 800 nm.

TABLE 5

| | | D, nm | | | | | | | |
|---|---|---|---|---|---|---|---|---|---|
| | | D $\leq$ 15 | 15 < D $\leq$ 30 | 30 < D $\leq$ 50 | 50 < D $\leq$ 75 | 75 < D $\leq$ 100 | 100 < D $\leq$ 125 | 125 < D $\leq$ 150 | 150 < D $\leq$ 175 | 175 < D $\leq$ 200 |
| Oxygen pressure, Pa | 3 | — | — | 0.8 | 1.1 | 1.7 | 1.5 | 4.3 | 3.3 | 3.1 |
| | 5 | — | — | 1.1 | 2.6 | 4.1 | 5.2 | 4.1 | 3.1 | 2.4 |
| | 8 | — | — | 1.4 | 4.1 | 4.3 | 4.3 | 3.6 | 2.9 | 2.1 |
| | 10 | — | — | 1.7 | 4.2 | 5.5 | 3.7 | 3.4 | 2.3 | 1.9 |
| | 13 | — | 0.4 | 2.3 | 4.3 | 4.8 | 3.7 | 3.3 | 2.1 | 1.4 |
| | 15 | — | 0.7 | 2.3 | 5.4 | 4.1 | 3.4 | 2.6 | 1.8 | 0.7 |
| | 20 | — | 1.2 | 4.1 | 4.2 | 3.6 | 2.7 | 1.7 | 1.2 | — |
| | 25 | — | 1.2 | 5.4 | 3.5 | 2.7 | 1.9 | 1.3 | 0.4 | — |
| | 30 | — | 1.3 | 4.3 | 2.6 | 2.0 | 1.3 | 0.6 | — | — |
| | 35 | — | 1.3 | 3.6 | 2.1 | 1.5 | 1.1 | — | — | — |
| | 40 | — | 1.5 | 2.3 | 1.6 | 1.3 | 0.7 | — | — | — |
| | 45 | — | 1.6 | 1.6 | 1.4 | 0.4 | — | — | — | — |
| | 50 | — | 1.5 | 1.4 | 1.4 | — | — | — | — | — |

Unit: $\times 10^6$ A/cm$^2$

The above results show that large electric power can be applied without sacrificing properties of a filter circuit by adopting a construction comprising a CeO$_2$ buffer layer and a thin YBCO film formed under conditions satisfying the above requirements provided on both sides of the R face sapphire substrate, a magnetic shielding layer provided on one side of the assembly, a filter circuit of MHz order or more, for example, a GHz band, provided on the other side of the assembly.

Thin (Re)BCO films having various thicknesses were grown on the buffer layer specified above, and the $J_c$ value thereof was measured. The results were as shown in Table 6.

The invention claimed is:

1. A superconducting member comprising:
   a sapphire R face substrate;
   a buffer layer provided on at least one surface of the sapphire R face substrate; and
   a superconducting layer having a thickness of not less than 350 nm and not more than 1000 nm provided on the buffer layer,
   wherein the buffer layer is formed of grain lumps of an oxide, the nearest neighbor distance between the oxygen atoms constituting a crystal face of the oxide parallel to the substrate surface is not more than 0.2705 nm, not less than 90% of grain lumps have a grain diameter of not less than 20 nm and not more than 70 nm, not less than 90% of the grain lumps satisfy a requirement of 5 nm $\leq$ D−d $\leq$ 20 nm wherein D represents a maximum thickness of the grain lump, and d represents a thickness of the grain lump in its part adjacent to other grain lump.

2. The superconducting member according to claim 1, wherein the grain lump has a D value of not less than 50 nm and not more than 150 nm wherein D represents the maximum thickness of the grain lump.

3. The superconducting member according to claim 1, wherein not less than 90% of the grain lumps have a grain diameter of not less than 30 nm and not more than 60 nm.

4. The superconducting member according to claim 1, wherein the oxide is selected from the group consisting of $LaAlO_3$, $CeO_2$, $Y_2O_3$, and $Dy_2O_3$.

5. The superconducting member according to claim 1, wherein the superconducting layer is provided on the buffer layer on both surfaces of the sapphire R face substrate.

6. The superconducting member according to claim 1, wherein the superconducting layer is formed of $ReBa_2Cu_3O_{7-\delta}$ wherein Re represents not more than three elements selected from lanthanum (La), yttrium (Y), samarium (Sm), europium (Eu), gadolinium (Gd), dysprosium (Dy), ytterbium (Yb), neodymium (Nd), holmium (Ho), and erbium (Er).

7. The superconducting member according to claim 1, wherein the buffer layer has been formed by CVD, vacuum vapor deposition, sputtering, or laser ablation.

8. The superconducting member according to claim 1, wherein the superconducting layer has been formed by CVD, vacuum vapor deposition, sputtering, or laser ablation.

9. The superconducting member according to claim 1, wherein the critical current value at a liquid nitrogen temperature is not less than 250 A/cm.

10. A superconducting filter comprising a superconducting member according to claim 1.

11. The superconducting member according to claim 1, wherein the thickness of the superconducting layer is not less than 400 nm and not more than 800 nm.

12. A process for producing a superconducting member, comprising:
providing a sapphire R face substrate;
forming a buffer layer of grain lumps of an oxide on at least one surface of the substrate; and
forming a superconducting layer having a thickness of not less than 350 nm and not more than 1000 nm on the buffer layer,
wherein the oxide is controlled so that the nearest neighbor distance between oxygen atoms constituting a crystal face of the oxide parallel to the substrate surface is not more than 0.2705 nm, not less than 90% of grain lumps have a grain diameter of not less than 20 nm and not more than 70 nm, not less than 90% of the grain lumps satisfy a requirement of 5 nm$\leq$D−d 20 nm wherein D represents a maximum thickness of the grain lump, and d represents a thickness of the grain lump in its part adjacent to other grain lump.

13. The process according to claim 12, wherein the substrate temperature is controlled so that the difference in substrate temperature between immediately after the start of the buffer layer formation and immediately after the completion of the buffer layer formation is in the range of 40° C. to 45° C.

14. The process according to claim 12, wherein the value of (D-d), is regulated by regulating the oxygen pressure during the growth of the buffer layer and selecting the thickness of the buffer layer.

15. The process according to claim 12, wherein the oxygen pressure at the time of the start of the buffer layer formation is brought to not more than 3 Pa, and, at the stage when the thickness of the buffer layer has been increased to 10 to 20% of the contemplated buffer layer thickness, the oxygen pressure is changed to a preset value to allow the buffer layer to grow to the contemplated thickness.

* * * * *